United States Patent
Mandal et al.

(10) Patent No.: US 6,576,568 B2
(45) Date of Patent: Jun. 10, 2003

(54) IONIC ADDITIVES FOR EXTREME LOW DIELECTRIC CONSTANT CHEMICAL FORMULATIONS

(75) Inventors: Robert P Mandal, Saratoga, CA (US); Alexandros T Demos, Fremont, CA (US); Timothy Weidman, Sunnyvale, CA (US); Michael P Nault, San Jose, CA (US); Nikolaos Bekiaris, San Jose, CA (US); Scott J Weigel, Allentown, PA (US); Lee A. Senecal, Vista, CA (US); James E. MacDougall, New Tripoli, PA (US); Hareesh Thridandam, Vista, CA (US)

(73) Assignees: Applied Materials, Inc., Santa Clara, CA (US); Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/823,932

(22) Filed: Mar. 29, 2001

(65) Prior Publication Data

US 2002/0042210 A1 Apr. 11, 2002

Related U.S. Application Data

(60) Provisional application No. 60/194,356, filed on Apr. 4, 2000.

(51) Int. Cl.$^7$ .................. H01L 21/31; H01L 21/469
(52) U.S. Cl. .................. 438/781; 438/780; 427/372.2; 427/419.2
(58) Field of Search .................. 438/780, 781; 427/255.11, 372.2, 376.2, 419.2

(56) References Cited

U.S. PATENT DOCUMENTS

| 5,548,159 A | 8/1996 | Jeng |
| 5,645,891 A | 7/1997 | Liu et al. |
| 5,736,425 A | 4/1998 | Smith et al. |

(List continued on next page.)

FOREIGN PATENT DOCUMENTS

| EP | 0 689 235 B1 | 12/1995 |
| EP | 0 869 515 A1 | 7/1998 |
| FR | 2621030 | 3/1989 |

(List continued on next page.)

OTHER PUBLICATIONS

Rust, W., "Using Spin–on Dielectrics to Solve Interconnect Challenges," Channel Techwatch, vol. 10, No. 9 (1997).

(List continued on next page.)

*Primary Examiner*—Alexander Ghyka
(74) *Attorney, Agent, or Firm*—Townsend and Townsend and Crew

(57) ABSTRACT

A process for depositing porous silicon oxide-based films using a sol-gel approach utilizing a precursor solution formulation which includes a purified nonionic surfactant and an additive among other components, where the additive is either an ionic additive or an amine additive which forms an ionic ammonium type salt in the acidic precursor solution. Using this precursor solution formulation enables formation of a film having a dielectric constant less than 2.5, appropriate mechanical properties, and minimal levels of alkali metal impurities. In one embodiment, this is achieved by purifying the surfactant and adding ionic or amine additives such as tetraalkylammonium salts and amines to the stock precursor solution. In some embodiments, the ionic additive is a compound chosen from a group of cationic additives of the general composition $[NR(CH_3)_3]^+A^-$, where R is a hydrophobic ligand of chain length 1 to 24, including tetramethylammonium and cetyltrimethylammonium, and $A^-$ is an anion, which may be chosen from the group consisting essentially of formate, nitrate, oxalate, acetate, phosphate, carbonate, and hydroxide and combinations thereof. Tetramethylammonium salts, or more generally tetraalkylammonium salts, or tetraorganoammonium salts or organoamines in acidic media are added to surfactant templated porous oxide precursor formulations to increase the ionic content, replacing alkali ion impurities (sodium and potassium) removed during surfactant purification, but which are found to exhibit beneficial effects in promoting the formation of the resulting dielectric.

15 Claims, 1 Drawing Sheet

U.S. PATENT DOCUMENTS

| | | | |
|---|---|---|---|
| 5,747,880 | A | 5/1998 | Havemann et al. |
| 5,807,607 | A | 9/1998 | Smith et al. |
| 5,814,370 | A | 9/1998 | Martino et al. |
| 5,834,845 | A | 11/1998 | Stolmeijer |
| 5,847,443 | A | 12/1998 | Cho et al. |
| 5,858,457 | A | 1/1999 | Brinker et al. |
| 5,858,871 | A | 1/1999 | Jeng |
| 5,922,299 | A | 7/1999 | Bruinsma et al. |
| 5,948,482 | A | 9/1999 | Brinker et al. |
| 5,955,140 | A | 9/1999 | Smith et al. |
| 6,011,123 | A | 1/2000 | Kurosawa et al. |
| 6,015,457 | A | 1/2000 | Leung et al. |
| 6,037,275 | A | 3/2000 | Wu et al. |
| 6,107,357 | A | 8/2000 | Hawker et al. |
| 6,120,891 | A | 9/2000 | Balkus, Jr. et al. |
| 6,140,252 | A | 10/2000 | Cho et al. |
| 6,159,295 | A | 12/2000 | Maskara et al. |
| 6,162,583 | A | 12/2000 | Yang et al. |
| 6,162,838 | A | 12/2000 | Kohl |
| 6,163,066 | A | 12/2000 | Forbes et al. |
| 6,168,737 | B1 | 1/2001 | Poco et al. |
| 6,171,645 | B1 | 1/2001 | Smith et al. |
| 6,171,687 | B1 | 1/2001 | Leung et al. |
| 6,172,128 | B1 | 1/2001 | Lau et al. |
| 6,184,260 | B1 | 2/2001 | Zhong |
| 6,187,248 | B1 | 2/2001 | O'Neill et al. |
| 6,197,913 | B1 | 2/2001 | Zhong |
| 6,204,202 | B1 | 3/2001 | Leung et al. |
| 6,208,014 | B1 | 3/2001 | Wu et al. |
| 6,270,846 | B1 | 8/2001 | Brinker et al. |
| 6,277,765 | B1 | 8/2001 | Chen et al. |
| 6,297,459 | B1 | 10/2001 | Wojnarowski et al. |
| 6,365,266 | B1 * | 4/2002 | MacDougall et al. ..... 428/304.4 |

FOREIGN PATENT DOCUMENTS

| | | |
|---|---|---|
| WO | WO 98/24724 | 6/1998 |
| WO | WO 99/03926 | 1/1999 |
| WO | WO 99/23101 | 5/1999 |
| WO | WO 99/37705 | 7/1999 |
| WO | WO 00/08679 | 2/2000 |
| WO | 00/13221 * | 3/2000 |

OTHER PUBLICATIONS

Peters L., "Solving the integration Challenges of Low–k Dielectrics," Semiconductor Int'l, 56–54 (1999).

Singer, P., "Dual–Damascene Challenges Dielectric Etch," Semiconductor Int'l., 68–72 (1999).

Hendricks, N., "Low K Materials for IC International Dielectric Applications: An Updated Status on the Leading Candidates," Low K Dielectric Mat. Tech., SEMICON West, B1–B12 (1999).

Patent Abstracts of Japan, Publication No. 03008709, Published Jan. 16, 1991.

Patent Abstracts of Japan, Publication No. 11035315, Published Feb. 9, 1999.

* cited by examiner

IONIC ADDITIVES FOR EXTREME LOW DIELECTRIC CONSTANT CHEMICAL FORMULATIONS

CROSS-REFERENCES TO RELATED APPLICATIONS

This application claims the benefit of U.S. Provisional Application Ser. No. 60/194,356 filed Apr. 4, 2000, which is incorporated herein by reference.

BACKGROUND OF THE INVENTION

The present invention relates to the formation of dielectric layers. More particularly, the present invention relates to a method for forming a low dielectric constant film that is particularly useful as a premetal or intermetal dielectric layer in an integrated circuit.

Semiconductor device geometries have dramatically decreased in size since integrated circuits were first introduced several decades ago, and all indications are that this trend will continue. Although today's wafer fabrication plants are routinely producing ever-shrinking devices, the plants of the future will soon be producing devices having even smaller geometries.

In order to continue to reduce the size of devices on integrated circuits, it has become necessary to use insulators having a low dielectric constant. Such films are particularly desirable for premetal dielectric (PMD) layers and intermetal dielectric (IMD) layers to reduce the RC time delay of the interconnect metalization, to prevent crosstalk between the different levels of metalization, and to reduce device power consumption. To this end, several semiconductor manufacturers, materials suppliers and research organizations have focused on identifying low and extremely low dielectric constant films. As used herein, low dielectric constant materials are those films having a dielectric constant between 3.0 to 2.5 and extremely low dielectric constant ("ELk") films are those films having a dielectric constant below 2.5 extending to dielectric constants below 2.0.

One approach for reducing the dielectric constant includes introducing high porosity into the dielectric film layer. The dielectric constant of air is nominally 1. Thus, dielectric films when made porous, tend to have much lower dielectric constants relative to the solid film, and values of dielectric constants less than 2.5 are becoming achievable.

One method of forming a particular type of ELk material is based on a sol-gel process, in which high porosity films are produced by hydrolysis and polycondensation of a silicon alkoxide such as tetraethylorthosilicate (TEOS). The sol-gel process is a versatile solution process for making ceramic material. In general, the sol-gel process involves the transition of a system from a homogeneous liquid "sol" (mostly colloidal) into a solid "gel" phase. The starting materials used in the preparation of the "sol" are usually inorganic salts or compounds such as silicon alkoxides. The precursor solutions are typically deposited on a substrate by spin on methods. In a typical sol-gel process, the precursor is subjected to a series of hydrolysis and polymerization reactions to form a colloidal suspension, or a "sol." Further processing of the "sol" enables one to make ceramic materials in different forms. The further processing may include the thermal decomposition of a thermally labile component, which may include the formation of an ordered surfactant-templated mesostructured film by evaporation-induced self-assembly, followed by the thermal decomposition of the template.

In a particular sol-gel-based process for forming a porous low dielectric constant film, surfactants act as the template for the film's porosity. The porous film is generally formed by the deposition on a substrate of a sol-gel precursor followed by selective evaporation of solvent components of the sol-gel precursor to form supramolecular assemblies. The assemblies are then formed into porous films by the pyrolysis of the supramolecular surfactant templates at a temperature range between approximately 300 and 450° C. This particular sol-gel-based process can produce porous films with controllable pore size and advantageously, with narrow distributions of pore size, which is beneficial for integrated circuit manufacture.

FIG. 1 is a flowchart illustrating a basic sol-gel-based process that has been previously proposed to deposit ELk films. As shown in FIG. 1, the first step is the synthesis of the stock precursor solution (step 100). The stock precursor solution is prepared, for example, by combining a soluble silicon oxide source, e.g., TEOS, water, a solvent, e.g., alcohol, and an acid catalyst, e.g., hydrochloric acid, in particular mole ratios at certain prescribed environmental conditions and mixed for certain time periods.

Once the stock solution is obtained, the coating solution is mixed (step 110). The general procedure to prepare the coating solution is to add a surfactant to the stock solution. The surfactants are used as templates for the porous silica. In later processes the surfactants are baked out (i.e., calcined), leaving behind a porous silicon oxide film. Typical surfactants exhibit an amphiphilic nature, meaning that they can be both hydrophilic and hydrophobic at the same time. Amphiphilic surfactants possess a hydrophilic head group or groups which have a strong affinity for water and a long hydrophobic tail which repels water. The long hydrophobic tail acts as the template member which later provides the pores for the porous film. Amphiphiles can aggregate into supramolecular arrays in solution and in the solidifying gel as the solvent is removed during spin-coating, forming a structure which serves as a template for the porous film. Templating oxides around these arrays leads to materials that exhibit controllable pore sizes and shapes. The surfactants can be anionic, cationic, or nonionic, though for the formation of dielectric layers for IC applications, non-ionic surfactants are generally preferred. The acid catalyst is added to accelerate the condensation reaction of the silica around the supramolecular aggregates.

After the coating solution is mixed it is deposited on the substrate (step 120) using a spinning process where centrifugal draining ensures that the substrate is uniformly coated with the coating solution. The coated substrate is then pre-baked to complete the hydrolysis of the TEOS precursor, continue the gelation process, and drive off any remaining solvent from the film (step 130).

The pre-baked substrate can then be further baked to form a hard-baked film (step 140). The temperature range chosen for the bake step will ensure that excess water is evaporated out of the spin cast film. At this stage the film is comprised of a hard-baked matrix of silica and surfactant with the surfactant possessing an interconnected structure characteristic of the type and amount of surfactant employed. An interconnected structure aids the implementation of the subsequent surfactant extraction phase. An interconnected structure provides continuous pathways for the subsequently ablated surfactant molecules to escape from the porous oxide matrix.

Typical silica-based films often have hydrophilic pore walls and aggressively absorb moisture from the surrounding environment. If water, which has a dielectric constant (k) of about 78, is absorbed into the porous film, then the low k dielectric properties of the film can be detrimentally affected. Often these hydrophilic films are annealed at elevated temperatures to remove moisture and to ablate and extract the surfactant out of the silica-surfactant matrix. Such an anneal step leaves behind a porous film exhibiting interconnected pores (step 150). But this is only a temporary solution in a deposition process since the films may still be sensitive to moisture absorption following this procedure.

Some sol-gel processes include further post-deposition treatment steps that are aimed at modifying the surface characteristic of the pores to impart various desired properties, such as hydrophobicity, and increased resistance to certain chemicals. A typical treatment that renders the film more stable is treatment with HMDS (hexamethyldisilizane, $[(CH_3)_3—Si—NH—Si—(CH_3)_3])$, in a dehydroxylating process which will remove the hydroxyl groups, replace them with trimethylsilyl groups, and render the film hydrophobic (step 160). Alternatively, or in conjunction with such a silylation step, the porous material may be rendered more hydrophobic by the addition of an alkyl substituted silicon precursor, such as methyl triethoxysilane, $CH_3Si(OCH_2CH_3)_3$, (MTES) to the precursor formulation. It has been found that replacement of a significant fraction of the TEOS with MTES (for example 30–70%) in the liquid precursor formulation generates films exhibiting good resistance to moisture absorption without subsequent exposure to HMDS.

A variety of alternatives to the above-described sol-gel process for depositing ELk materials have been proposed. Many of these alternatives follow the same basic general approach discussed above but vary the choice of ingredients used in the coating solution, the processing times and/or temperatures; combine certain steps; and/or divide other steps into various substeps.

However, none of the variations or alternatives known to the present inventors are suitable for use in integrated circuit fabrication due to the unacceptable impurity types or poorly controlled or uncontrolled impurity levels associated with commercially available surfactant components in the precursor solutions used for porous ELk deposition.

In order for the film to be suitable and allow for a successful integration for IC fabrication, the film must have controlled level of impurities or it must be deposited using ingredients that have minimal levels of impurities that are harmful in silicon oxide-based insulator films in microelectronic devices. Impurities that are harmful in silicon oxide-based insulator films include alkali ions such as sodium and potassium which transport under the influence of an electric field and which are non-volatile. These impurities are typically introduced into the film as parts of the surfactants which are used in surfactant templated porous oxide precursor formulations.

It is known in the semiconductor integrated circuit industry that alkali metal ions (such as sodium and potassium) must be rigorously excluded from silicon dioxide films used as MOS transistor insulators and multilevel interconnection insulators because these positively-charged ions are mobile when exposed to electric fields, drifting away from the positively-biased film interface and toward the negatively-biased film interface, causing capacitance-voltage shifts. While the exclusion of sodium has received the most attention because of its ubiquitous presence and high mobility, other alkali ions, especially potassium and lithium, are also equally problematic and must also be excluded from insulator films. Alkali metal impurity specifications for chemical precursor solutions (e.g., TEOS) for integrated circuit applications typically set the allowable impurity levels to approximately 20 parts per billion maximum for each type of alkali metal.

As stated above, the surfactants can be anionic, cationic, or nonionic, through for microelectronic applications the class of nonionic surfactants are generally preferred. Most anionic surfactants are not suitable for microelectronic applications because the molecules contain either alkali or alkaline earth metals, sulfate or sulfonate groups that are considered contaminants in microelectronic devices. Although cationic surfactants differ structurally from anionic surfactants, they may suffer from similar problems, as they necessarily incorporate counteranions which may remain in the film and exhibit migration under electric fields or promote corrosion of metal or barrier films.

Therefore, there is a need to arrive at a formulation which uses surfactants that do not contain the impurities which are unacceptable for microelectronic applications, yet which produce low dielectric constant films.

SUMMARY OF THE INVENTION

Embodiments of the present invention provide a process for depositing porous silicon oxide-based films using a sol-gel approach utilizing a precursor solution formulation which includes a purified nonionic surfactant and an additive among other components, where the additive is either an ionic additive or an amine additive which forms an ionic ammonium type salt in the acidic precursor solution. Using this precursor solution formulation enables formation of a film having a dielectric constant less than 2.5, mechanical properties sufficient for IMD or PMD layers in fabricating ICs, and minimal levels of alkali metal impurities. In one embodiment, this is achieved by purifying the surfactant and adding ionic or amine additives such as tetraalkylammonium salts and amines to the stock precursor solution.

In some embodiments, the ionic additive is a compound chosen from a group of cationic additives of the general composition $[NR(CH_3)_3]^+A^-$, where R is a hydrophobic ligand of chain length 1 to 24, including tetramethylammonium and cetyltrimethylammonium, and $A^-$ is an anion, which is chosen from the group consisting essentially of formate, nitrate, oxalate, acetate, phosphate, carbonate, and hydroxide and combinations thereof. Tetramethylammonium salts, or more generally tetraalkylammonium salts, or tetraorganoammonium salts or organoamines in acidic media are added to surfactant templated porous oxide precursor formulations to increase the ionic content, replacing alkali ion impurities (sodium and potassium) removed during surfactant purification, but which are found to exhibit beneficial effects for the resulting dielectric.

These and other embodiments of the present invention as well as its advantages, are described in more detail in conjunction with the description below and the attached figure.

DESCRIPTION OF THE SPECIFIC EMBODIMENTS

Figure 1:
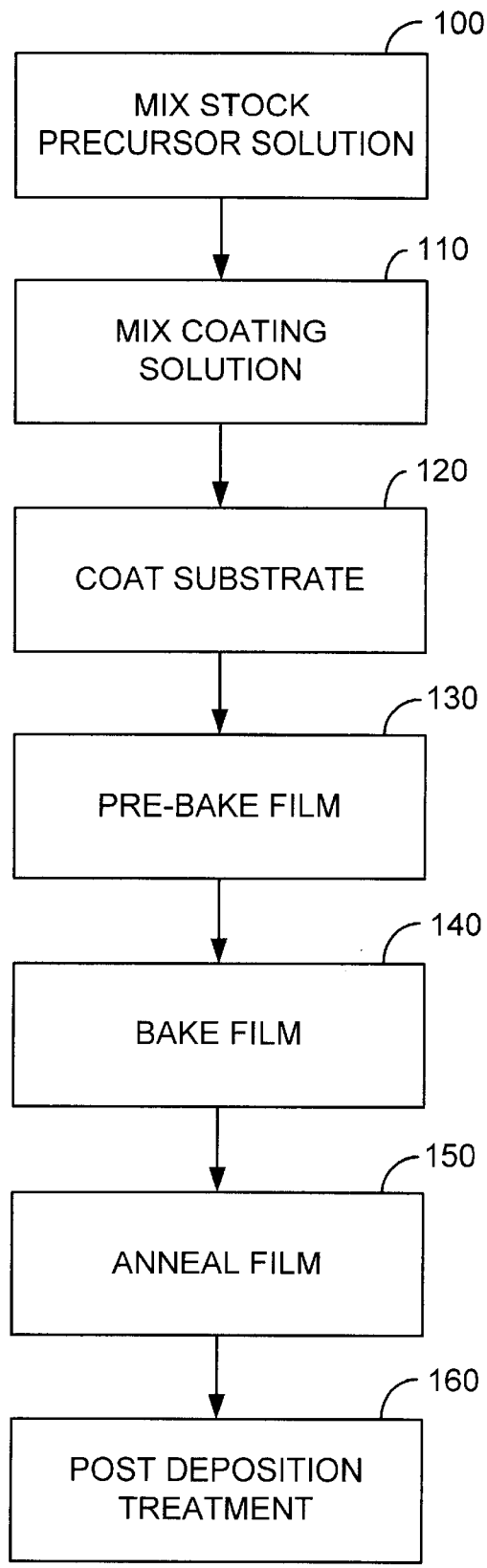
FIG. 1 is a flowchart of a typical process in which a templated sol-gel process is used to deposit a porous silicon oxide layer.

Embodiments of the present invention are directed towards particular compositions for spin-on precursor solutions used to deposit a type of porous silicon oxide dielectric layer. Specifically, embodiments of the present invention describe additives to use in conjunction with particular precursor formulations which use purified surfactants for depositing porous ELk material. The surfactants are purified to remove impurities from the surfactant molecules, to reduce or eliminate the presence of alkali metal and alkali ion impurities, which are known to be detrimental to integrated circuit fabrication.

It is known in the semiconductor integrated circuit industry that alkali metal ions (such as sodium and potassium) should be excluded from silicon dioxide films used as MOS transistor insulators and multilevel interconnection insulators because these positively-charged ions are mobile when exposed to electric fields, drifting away from the positively-biased film interface and toward the negatively-biased film interface, causing capacitance-voltage shifts. While, the exclusion of sodium has received the most attention because of its ubiquitous presence and high mobility, the other alkali ions, especially potassium and lithium, must also be kept to acceptable levels. Alkali metal impurity specifications for chemical precursor solutions (e.g., TEOS) for integrated circuit applications are typically set to allow impurity levels of about 20 parts per billion maximum for each type of alkali metal.

The inventors have found that alkali metal ions have higher mobility in porous silicon oxide-based films than in the dense silicon oxide films that have generally been used for integrated circuits. Even cesium ions, which have very low mobility in dense silicon oxide films compared to sodium ions, appear to transport through porous ELk films under the influence of electric fields. Therefore, for porous silicon oxide-based films, alkali metal impurity concentrations in ELk film chemical precursor solutions should be less than the 20 parts per billion for each type of alkali metal. While these requirements may be relaxed in the future, control of alkali metal impurity concentration will still be important.

While commercially-available unpurified surfactants could be used in chemical formulations to form porous films with desired low dielectric constants, the final films will have impurity levels far in excess of acceptable levels, and thus the surfactant must be purified. Surfactant purification can be performed using common procedures, such as employment of ion exchange columns in which alkali ions can be retained and hydrogen ions released in their place. These unpurified surfactants may commonly possess alkali ion concentrations in the range from about 100 to 1000 parts per million. The goal of surfactant purification is to reduce alkali ion impurity levels to less than 50 parts per billion. Acceptable concentrations of alkali ion impurities in ELk film chemical precursor solutions are less than 10 parts per billion for each alkali element.

However, surprisingly, the inventors discovered that when depositing films from a precursor formulation with a surfactant that was purified (to contain alkali ion impurity levels to less than 50 parts per billion) to remove undesired alkali metal ion impurities (most notably sodium or potassium ions), the deposited films had relatively high dielectric constants, approaching that of dense silicon dioxide. The inventors believe that this might be attributed to a failure to form a stable mesophase due to a weaker mesophase separation, and/or to a collapse of the porous structure during calcination.

Very significantly, it was subsequently discovered that a purified surfactant could be used to produce porous films with desired low dielectric constants if specific types of ionic or amine additives were added to the formulation in relatively low concentration. These impurities are believed to strengthen the mesophase separation and promote hardening of the pore wall so as to prevent collapse and permit the thermal decomposition and removal of the surfactant to provide the porous film.

Generally, the ionic additive is a compound chosen from a group of cationic additives of the general composition $[NR(CH_3)_3]^+A^-$, where R is a hydrophobic ligand of chain length 1 to 24, including tetramethylammonium and cetyltrimethylammonium, and $A^-$ is an anion, which may be chosen from the group consisting essentially of formate, nitrate, oxalate, acetate, phosphate, carbonate, and hydroxide and combinations thereof. Tetramethylammonium salts, or more generally tetraalkylammonium salts, or tetraorganoammonium salts or organoamines in acidic media are added to surfactant templated porous oxide precursor formulations to increase the ionic content, replacing alkali ion impurities (sodium and potassium) removed during surfactant purification, but which are found to exhibit beneficial effects towards achieving low dielectric constants.

While the additive may be an ionic additive as is generally described above, the additive may alternately be an amine additive which forms an ionic ammonium type salt in the acidic precursor solution. While not being limited to any particular theory, the inventors suggest that the amine additive which forms an ionic ammonium type salt in the acidic precursor solution facilitates a pH shift during thermal processing of the film which may be crucial to porous film formation.

The suitable amine additive is selected from the group consisting of:
TEDA, triethylenediamine, $(CH_2)_6N_2$;
DELA, diethanolamine, $(HOCH_2CH_2)_2NH$;
TELA, triethanolamine, $(HOCH_2CH_2)_3N$;
APDEA, aminopropyldiethanolamine, $(HOCH_2CH_2)_2N(CH_2CH_2CH_2NH_2)$;
PACM, bis(p-aminocyclohexyl)methane, $NH_2(C_6H_{10})CH_2(C_6H_{10})NH_2$;
QUIN, quinuclidine, $N(CH_2)_6CH$;
3-Quinuclidinol, $N(CH_2)_6CH$;
TMA, trimethylamine, $(CH_3)_3N$;
TMEDA, tetramethylethylendiamine, $(CH_3)_2NCH_2CH_2N(CH_3)_2$;
TMPDA, tetramethyl-1,3-propanediamine, $(CH_3)_2N(CH_2)_3N(CH_3)_2$;
TMA(O, trimethylamine oxide, $(CH_3)_3N(O)$;
PC-9, N,N,N-tris(N',N'-dimethyl-3-aminopropyl)amine, $((CH_3)_2NCH_2CH_2CH_2)_3N$;
PC-77, 3,3'-bis(dimethylamino)-N-methyldipropylamine, $((CH_3)_2NCH_2CH_2CH_2)_2NCH_3$;
CB, choline hydroxide, $HOCH_2CH_2N(CH_3)_3OH$;
DMAP, 4-dimethylaminopyridine, $(CH_3)2N(C_6H_5N)$;
DPA, diphenylamine, $(C_6H_5N)_2NH$;
TEPA, tetraethylenepentamine, $HN(CH_2CH_2NHCH_2CH_2NH_2)_2$.

As can be recognized, numerous alternate embodiments of the ELk film may be deposited depending upon the choice of the spin-on solution ingredients, in particular, the surfactant and the additive and processing times and parameters. The ELk films deposited according to some embodiments of this invention exhibit the following properties:
the film is composed essentially of Si—O and Si—CH$_3$ bonds
a dielectric constant in the range between 1.4 and 2.5 a porosity between 20% and 60% a modulus of elasticity of between 1.4 and 10 GPa, and generally between 2 and 6 GPa a hardness value between 0.2 and 2.0 GPa, and generally between 0.4 and 1.2 GPa a refractive index at 633 nm of between 1.1 and 1.5

Additive levels in the final ELk chemical precursor formulation are approximately in the range between 0.1 to 2000 parts per million, and in some embodiments in the range between 1 and 500 parts per million.

As described above, a particular sol-gel-based process as shown in FIG. 1 may be used to deposit surfactant templated ELk films. As described by steps 100 to 160 of FIG. 1, an Elk film is formed by forming a templated sol-gel ELk chemical precursor formulation, spin coating a substrate with the precursor formulation and then thermally treating the coated substrate to form a porous dielectric layer thereon. Specific embodiments of the present invention are directed to the particular method for the formation of the precursor solution composition which are described as steps 100 and 110 of FIG. 1.

Specifically, the templated sol-gel ELk chemical precursor, according to embodiments of the present invention is formulated by mixing two solutions and then adding the purified surfactant to the mixture of the two solutions, where a first solution is obtained by mixing a soluble silicon oxide source (e.g., TEOS), an alkyl substituted silicon precursor (e.g., MTES) and a solvent, and where a second solution is obtained by mixing water, the acid catalyst and the additive. As described above, the additive is an ionic additive or alternately an amine additive which forms an ionic ammonium type salt in the acidic precursor formulation as described above.

Alternately, the templated sol-gel ELk chemical precursor, according to another embodiment of the present invention is formulated by mixing together two solutions, where a first solution is obtained by mixing a soluble silicon oxide source (e.g., TEOS), an alkyl substituted silicon precursor (e.g., MTES), a solvent and the purified surfactant, and where a second solution is obtained by mixing together water, the acid catalyst and the additive, and further where the additive is an ionic additive or alternately an amine additive which forms an ionic ammonium type salt in the acidic precursor formulation as described above.

Yet, in other alternate precursor formulations, the purified surfactant is added to the solution containing the water, the acid and the additive instead of the silica-containing solution. It is desirable to form two separate solutions where one is the solution containing the solvent, the water, the acid and the additive and the other is the solution containing the silica precursors and the solvent. The surfactant can be added to either of the solutions. Forming the final precursor solution from these two solutions enables the creation of two long-shelf-life solutions, which is commercially advantageous over other highly reactive solutions having a relatively short shelf life. The final precursor solution formed by mixing the two solutions has a much shorter shelf life than the two separate solutions. For example, each of the two separate solutions are chemically stable with a shelf life of over 6 months, while the final precursor formulation which is used to coat substrates is chemically stable for less than a week. Another advantage of forming a final precursor solution from the two long-shelf life solutions is that it enables the formation of highly reactive mixture before coating the substrates. The highly reactive mixture will allow for a quicker cure of the coated substrates to form a stable film in a reduced time. Thus, a deposition apparatus can be developed to first mix the two long-shelf-life solutions together to form the more reactive formulation mixture to be applied to the wafer.

An example of such a deposition apparatus is described in copending U.S. application Ser. No. 09/692,660, assigned to Applied Materials, Inc., and entitled "ULTRASONIC SPRAY COATING OF LIQUID PRECURSOR FOR LOW K DIELECTRIC COATINGS," which is hereby incorporated herein by reference in its entirety.

Embodiments of the present invention are further described by comparing example formulations prepared in accordance with the method of the present invention (Invention Example 1) to two comparative examples. The comparative examples, (i.e., Comparative Examples 1 and 2) describe prior art processes including: a basic precursor solution formulation using industrially available (unpurified) surfactants (i.e., Comparative Example 1); and variant formulations using a purified surfactant (i.e., Comparative Example 2). An example of the invention (i.e., Invention Example 1) describe formulations which has additional amounts of additives added to compensate for the effects of the material impurities removed by purification of the surfactant.

Before describing the purified formulation (Comparative Example 2) or formulations having additives (Invention Example 1), an example of a precursor formulation using an unpurified surfactant is described below (Comparative Example 1). This example (Comparative Example 1) serves as a foundation for the remaining examples.

COMPARATIVE EXAMPLE 1

Precursor Formulation Using an Unpurified Surfactant

This example describes a prior art process for preparing a precursor formulation using an unpurified surfactant to form a porous oxide-based film. Using this formulation, an ELk film was deposited according to a sol-gel-based process as described above by steps 100–150. During steps 100–150 a precursor solution containing at least a silica precursor composed primarily of a silicon/oxygen compound, water, a solvent, a surfactant and a catalyst was formed. The precursor solution was spun on the wafer and the wafer thermally treated by being baked in a chamber at various temperatures between about 90° C. and 450° C. for between about 30 and 3600 seconds in inert or oxidizing environments having pressures in the range from about 0.1 Torr to atmospheric. The silicon/oxygen compounds were selected from the group consisting of tetraethylorthosilicate, tetramethoxysilane, phenyltriethoxysilane, methyltriethoxysilane, 1,1,3,3-tetraethoxy-1,3-dimethyldisiloxane, and combinations thereof. The solvent was selected from the group consisting of ethanol, isopropanol, propylene glycol monopropyl ether, n-propanol, n-butanol, t-butanol, ethylene glycol and combinations thereof. The catalysts were selected from the group consisting of acetic acid, formic acid, glycolic acid, glyoxylic acid, oxalic acid and nitric acid. The surfactant was a non-ionic surfactant selected for example from the group consisting of polyoxyethylene oxides-propylene oxides-polyethylene oxides triblock copolymers (such as the Pluronics line of surfactants marketed by BASF, and Brij line marketed by ICI), octaethylene glycol monodecyl ether, octaethylene glycol monohexadecyl ether, Triton™ 100, Triton™ 114, Triton™ 45, and related compounds and combinations thereof. The particular unpurified surfactant used was from the Triton™ series offered by Union Carbide and more specifically the Triton™ X-114 surfactant, which is an octylphenol ethoxylate-type surfactant. The use of the X-114 surfactant results in films having smaller and more uniform pore sizes, than other non-Triton surfactants listed.

In particular, the specific precursor formulation used in this example (Comparative Example 1) had the following composition: tetraethoxysilane (TEOS—22.5 gms; methyltriethoxysilane (MTES)—22.5 gms; propylene glycol monopropyl ether (PGPE)—46.72 gms; 0.1N Nitric acid—24 gms; and Triton X-114—9.67 gms (Triton 114 is trademark of a mixture of ethoxylated p-tert-octylphenols manufactured by the Union Carbide Corporation).

The inventors deposited silicon oxide-based films using the commercially available nonionic surfactants which contain alkali metal impurities. Alkali metal impurities are commonly present in commercial surfactants in the range between about 100 to 1000 parts per million. While these films possessed the necessary requirements for microelectronic devices including very low dielectric constants (less than 2.5), good adhesion, high modulus of elasticity, and small pores sizes, the presence of unacceptable levels of alkali metal and alkali ion impurities contained within the surfactant, rendered these silicon oxide-based films unacceptable for microelectronic applications. As described above, acceptable levels of alkali metal impurity concentrations in ELk film chemical precursor solutions are less than 20 parts per billion for each type of alkali metal, and preferably less than 10 parts per billion for each alkali element.

Therefore, the inventors aimed to develop a formulation which could be used to form ELk films having minimal levels of impurities by using an improved surfactant in the precursor formulation. An improved surfactant for this formulation is readily purifiable by distillation, ion exchange chromatography, or ideally can be prepared without the use of problematic impurities such as alkali metal compounds.

COMPARATIVE EXAMPLE 2

Precursor Formulation Using a Purified Surfactant

This example describes a process for the formation of precursor formulation using a purified surfactant to deposit a film. The difference between the formulation of this example (Comparative Example 2) and the specific formulation of the previous example (Comparative Example 1) is that the formulation in this example uses a purified form of the Triton™ surfactant, i.e., one where the alkali metal impurities were removed from the surfactant before it was added to the coating solution. Alkali metal impurities in the purified surfactant were approximately less than 50 parts per billion. Surfactant purification can be performed using common procedures, such as employment of ion exchange columns in which alkali ions can be retained and hydrogen ions released in their place. Using this formulation, an ELK film was deposited based on a sol-gel process as described above by steps 100–150.

However, once the inventors deposited films using the purified surfactants, an unexpected result was discovered in that the pores were not formed in the films and hence the films collapsed to a thickness much lower than that expected and the films' dielectric constant increased to unacceptable values (higher than 3.0). The increase in the dielectric constant is believed to be at least due to the loss of porosity in the film. Thus, the inventors found that the absence of the alkali metal ion impurities present in commercial detrimentally impacts the properties of the final film using such a purified formulation.

INVENTION EXAMPLE 1

Precursor Formulation Using a Purified Surfactant and Additives and Effects of Additives This example describes specific formulations for depositing porous silicon oxide-based films using a sol-gel-based process utilizing a precursor solution formulation which includes a purified nonionic surfactant and an ionic additive in accordance with embodiments of the present invention. Alkali metal impurities in the purified surfactant were approximately less than 50 parts per billion. The difference between the formulation of this example (Invention Example 1) and the formulation of the previous example (Comparative Example 2) is the addition of the additive to the precursor formulation as is described below. Using this precursor solution formulation the deposited films' properties meet the requirements of having a dielectric constant less than or equal to 2.5, and high porosity, while containing minimal levels of alkali metal impurities.

In particular formulations, tetramethylammonium salts including tetramethylammonium formate, tetramethylammonium nitrate, tetramethylammonium oxalate, tetramethyl ammonium hydroxide and tetramethylammonium acetate were added to the precursor formulation. The precursor solution was then formulated by adding the additive to a first solution containing the water and the acid and adding this first solution to a second solution containing the TEOS, the MTES, the solvent and the surfactant. It is believed that the volatilization of acid components during subsequent thermal processing may have shifted the effective pH in the film from acid to neutral or basic, thus promoting the condensation of the sol-gel network precursor to the pore walls) around the surfactant, although other mechanisms are not ruled out. Three specific types of films were prepared using three specific additive-enhanced formulations. These three film types were formed on wafers 2–7 as shown on Table 1 below. The amounts and type of additives for the three formulations are shown below in Table 1. The surfactant used for all cases shown in Table 1 is a the Triton™ 114 surfactant purified to remove alkali metal ion impurities.

TABLE 1

| Wafer No. | Solution Used | Additive | Thickness- Å | K |
|---|---|---|---|---|
| 1. | Purified 114 | None | 4055 | 3.30 |
| 2. | Purified 114 | 0.25 g of 25% of tetramethyl ammonium formate | 5903 | 2.12 |
| 3. | Purified 114 | 0.05 g of 25% of tetramethyl ammonium nitrate | 5907 | 2.14 |
| 4. | Purified 114 | 700 ppm tetramethyl ammonium hydroxide (TMAH) | 4630 | 2.26 |
| 5. | Purified 114 | 100 ppm TMAH | 6480 | 2.28 |
| 6. | Purified 114 | 30 ppm TMAH | 6268 | 2.27 |
| 7. | Purified 114 | 15 ppm TMAH | 6409 | 2.24 |

Table 1 provides the dielectric constant data of films deposited from various precursor formulations shown in Table 1. As can be seen from this table, the effect of the addition of the tetramethylammonium salts is dramatic. For example, the formulation used to deposit the oxide-based film on wafer 1 used no added salt. As can be seen from on Table 1, wafer 1's deposited film thickness is 4055 Å having a dielectric constant of 3.3. On the other hand, by the addition of 0.25 g of tetramethylammonium formate to the precursor solution, the results shown for wafer 2 were obtained, which had a deposited film thickness of 5903 Å and a dielectric constant of 2.12. Similar results were obtained with the addition of 0.05 g of tetramethylammonium nitrate to the precursor solution before depositing the film on wafer 3. The increased film thickness was due to increased pore formation in the film with the addition of the salt additive.

The formulation used to form a porous oxide film on wafers 4, 5, 6 and 7 used a 2.4 wt. % solution of tetramethylammonium hydroxide (TMAH) solution as an additive. The quantity of the additive added to the solution ranged from 700 ppm to 15 ppm relative to the precursor formulation. As can be seen from the results in Table 1, TMAH also results in the formation of thicker films as compared to the films formed using a purified surfactant where no additive was present in the formulation. The results for TMAH addition show that, in general, an increase in the quantity of the added TMAH results in an increase in film thickness and a reduction in the dielectric constant of the film as compared to films deposited using additive-free formulations. These results confirm the utility of this approach for restoration of the desired film properties for IMD or other electronic applications.

While not being limited to any particular theory, the inventors believe these results may be due to the fact that the salts play a similar role as the removed alkali metals in promoting sol condensation, and in stabilizing the mesophase structure prior to and during thermal processing steps. Moreover, these results may be also due to the improved atomic level interactions between the surfactant molecules and silica species. As is known, formation of surfactant templated thin films is based on co-assembly of silica and surfactant by means of electrostatic or hydrogen bonding interactions.

Having fully described several embodiments of the present invention, many other equivalent or alternative methods of forming a precursor solution for depositing a porous oxide film according to the present invention will be apparent to those skilled in the art. For example, the ionic additives could be added to either the stock or the coating precursor solution. These equivalents are intended to be included within the scope of the present invention which is set forth in the following claims.

What is claimed is:

1. A process for forming a dielectric layer over a substrate, said process comprising:
    coating said substrate with a solution comprising a soluble source of silicon oxide, water, a solvent, a nonionic surfactant, a non-basic ionic additive, and an acid catalyst; and
    treating said coated substrate to harden said solution into a porous silicon oxide film.

2. The process of claim 1 wherein said nonionic surfactant is first purified to remove alkali metal impurities.

3. The process of claim 1 wherein said nonionic surfactant comprises less than or equal to 50 parts per billion of any alkali metal.

4. The process of claim 1 wherein said ionic additive is a compound selected from the group consisting of (a) tetraalkylammonium salts, (b) tetraorganoammonium salts, (c) organoamines in acidic media and combinations thereof.

5. The process of claim 1 wherein said ionic additive is a compound chosen from the group consisting of tetraalkylammonium salts and salts with the general cationic composition $[NR(CH_3)_3]^+A^-$, where R is a hydrophobic ligand of chain length 1 to 24, and $A^-$ is an anion.

6. The process of claim 1 wherein said ionic additive is added to said solution in an amount in the range between 0.1 and 2000 parts per million.

7. The process of claim 1 wherein said ionic additive is selected from the group consisting of (a) a tetramethylammonium salt and (b) a salt exhibiting complete decomposition to volatile species upon heating to a temperature between 300 and 450° C., and which leaves no residue.

8. The process of claim 1 wherein said ionic additive is a compound chosen from a group of cationic additives of the general composition $[NR(CH_3)_3]^+A^-$, where R is a hydrophobic ligand of chain length 1 to 24, including tetramethylammonium and cetyltrimethylammonium, and $A^-$ is an anion, which is chosen from the group consisting of formate, nitrate, oxalate, acetate, phosphate, carbonate and hydroxide and combinations thereof.

9. The process of claim 1 wherein said ionic additive is a tetramethylammonium salt chosen from a group of compounds consisting of
    tetramethylammonium formate, tetramethylammonium nitrate, tetramethylammonium oxalate, tetramethylammonium acetate, tetramethylammonium hydroxide and other salt exhibiting complete decomposition to volatile species upon heating to a temperature between 300 and 450° C. and which leaves no residue.

10. The process of claim 1 wherein said solution is formulated by combining at least a first mixture and a second mixture.

11. The process of claim 10 wherein said first mixture and said second mixture are combined prior to said coating.

12. The process of claim 10 wherein said first mixture comprises a solvent, water, an acid catalyst and the ionic additive, and said second mixture comprises a soluble silicon oxide source a solvent.

13. A process for forming a dielectric layer over a substrate, said process comprising:
    coating said substrate with a solution comprising a soluble source of silicon oxide, water, a solvent, a nonionic surfactant, a non-basic ionic additive, and an acid catalyst; and
    treating said coated substrate to harden said solution into an porous silicon oxide film, wherein said nonionic surfactant is first purified to remove alkali metal impurities; and wherein said ionic additive is selected from the group consisting of (a) tetraalkylammonium salts, (b) tetraorganoammonium salts, (c) organoamines in acidic media and combinations thereof.

14. A process for forming a dielectric layer over a substrate, said process comprising:
    coating said substrate with a solution comprising a soluble source of silicon oxide, water, a solvent, a nonionic surfactant, a non-basic ionic additive, and an acid catalyst; and
    treating said coated substrate to harden said solution into a porous silicon oxide film, wherein said nonionic surfactant is first purified to remove alkali metal impurities; and wherein said ionic additive is a tetramethylammonium salt chosen from a group of compounds consisting of tetramethylammonium formate, tetramethylammonium nitrate, tetramethylammonium oxalate, tetramethylammonium acetate, tetramethylammonium hydroxide and other salt exhibiting complete decomposition to volatile species upon heating to a temperature between 300 and 450° C. and which leaves no residue.

15. A process for forming a dielectric layer over a substrate, said process comprising:

coating said substrate with a solution comprising a soluble source of silicon oxide, water, a solvent, a nonionic surfactant, a non-basic ionic additive, and an acid catalyst; and treating said coated substrate to harden said solution into a porous silicon oxide film, wherein said nonionic surfactant is first purified to remove alkali metal impurities; and wherein said ionic additive is a compound chosen from a group of cationic additives of the general composition $[NR(CH_3)_3]^+A^-$, where R is a hydrophobic ligand of chain length 1 to 24, including tetramethylammonium and cetyltrimethylammonium, and $A^-$ is an anion, which is chosen from the group consisting of formate, nitrate, oxalate, acetate, phosphate, carbonate, and hydroxide and combinations thereof.

* * * * *